United States Patent
Kanaya

(10) Patent No.: US 12,075,617 B2
(45) Date of Patent: Aug. 27, 2024

(54) NON-VOLATILE SEMICONDUCTOR MEMORY DEVICE

(71) Applicant: ROHM CO., LTD., Kyoto (JP)

(72) Inventor: Toshiyuki Kanaya, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 409 days.

(21) Appl. No.: 16/931,164

(22) Filed: Jul. 16, 2020

(65) Prior Publication Data
US 2021/0020646 A1    Jan. 21, 2021

(51) Int. Cl.
| | |
|---|---|
| *H01L 27/11521* | (2017.01) |
| *G11C 16/08* | (2006.01) |
| *G11C 16/12* | (2006.01) |
| *G11C 16/24* | (2006.01) |
| *H10B 41/30* | (2023.01) |
| *H10B 43/30* | (2023.01) |

(52) U.S. Cl.
CPC ............. *H10B 41/30* (2023.02); *G11C 16/08* (2013.01); *G11C 16/12* (2013.01); *G11C 16/24* (2013.01); *H10B 43/30* (2023.02)

(58) Field of Classification Search
CPC ......... G11C 16/26; G11C 16/10; G11C 16/12; G11C 16/24; G11C 16/0408; G11C 16/08; G11C 16/14; H01L 27/11521; H01L 27/11558; H01L 27/11568
USPC .................................................. 257/314, 438
See application file for complete search history.

(56) References Cited

U.S. PATENT DOCUMENTS

| | | | | |
|---|---|---|---|---|
| 3,900,806 A | * | 8/1975 | Caroli ....................... | H01P 9/00 333/156 |
| 5,194,929 A | * | 3/1993 | Ohshima ............. | H01L 29/7885 257/644 |
| 5,691,937 A | * | 11/1997 | Ohta .................. | H01L 29/42324 257/E27.103 |

(Continued)

FOREIGN PATENT DOCUMENTS

| | | |
|---|---|---|
| CN | 101183666 A | 5/2008 |
| JP | H0473964 A | 3/1992 |

(Continued)

OTHER PUBLICATIONS

Merriam-Webster OnLine Dictionary defintion of "Portion." No Date.*

(Continued)

*Primary Examiner* — Hrayr A Sayadian
(74) *Attorney, Agent, or Firm* — Rabin & Berdo, P.C.

(57) ABSTRACT

A non-volatile semiconductor memory device, includes: a semiconductor substrate; a first insulating layer disposed on the semiconductor substrate; a first conductive layer disposed on the first insulating layer and constituting a first floating gate of one of memory cells adjacent to each other; a second conductive layer disposed on the first insulating layer and constituting a second floating gate of the other one of the memory cells adjacent to each other; a third insulating layer covering the first conductive layer and the second conductive layer; and a fourth insulating layer disposed on the third insulating layer, wherein electric charges are held in each of the first conductive layer and the second conductive layer electrically insulated by separating the fourth insulating layer in distance from the first conductive layer and the second conductive layer.

9 Claims, 18 Drawing Sheets

(56) References Cited

U.S. PATENT DOCUMENTS

| | | | |
|---|---|---|---|
| 6,169,307 B1* | 1/2001 | Takahashi | G11C 16/0433 |
| | | | 257/315 |
| 6,291,853 B1* | 9/2001 | Io | H01L 27/11529 |
| | | | 257/314 |
| 2007/0120172 A1 | 5/2007 | Hsu et al. | |
| 2009/0159946 A1 | 6/2009 | Huang et al. | |
| 2015/0091073 A1 | 4/2015 | Li et al. | |
| 2016/0093628 A1 | 3/2016 | Chen et al. | |

FOREIGN PATENT DOCUMENTS

| | | |
|---|---|---|
| JP | H11135652 A | 5/1999 |
| JP | 2005-175411 A | 6/2005 |
| JP | 2009081181 A | 4/2009 |
| JP | 2013016598 A | 1/2013 |
| JP | 2013157481 A | 8/2013 |
| JP | 2016009692 A | 1/2016 |
| JP | 6276447 B1 | 2/2018 |

OTHER PUBLICATIONS

Merriam-Webster IOnLine definition of "to be . . . " No Date.*
Japanese Office Action dated Oct. 31, 2023, in the counterpart Japanese Patent Application No. 2019-132451.
Japanese Office Action dated Jun. 6, 2023, in the counterpart Japanese Patent Application No. 2019-132451.
German Office Action dated Apr. 28, 2022.

* cited by examiner

FIG. 2

|  | Write operation | | Read operation | | Erase operation |
|---|---|---|---|---|---|
|  | Selection | Non-selection | Selection | Non-selection |  |
| Write bit line(PG) | VP | VI | VSS | VSS | VI |
| Read bit line(BL) | VSS | VSS | VDD | VSS | VSS |
| Coupling gate line(CG) | VM | VI | VDD | VDD | VP |
| Substrate voltage line(NW) | VP | VP | VDD | VDD | VP |
| Switch gate line(RG) Read-selected cell | VSS | VSS | VDD | VSS | VSS |
| Source line(SL) | VSS | VSS | VSS | VSS | VSS |
| Erase gate line(EG) | VSS | VSS | VSS | VSS | VM |

NON-VOLATILE SEMICONDUCTOR MEMORY DEVICE

CROSS-REFERENCE TO RELATED APPLICATION

This application is based upon and claims the benefit of priority from Japanese Patent Application No. 2019-132451, filed on Jul. 18, 2019, the entire contents of which are incorporated herein by reference.

TECHNICAL FIELD

The present disclosure relates to a non-volatile semiconductor memory device.

BACKGROUND

A multi time programmable ROM (MTP) as a non-volatile memory that can be rewritten multiple times is a non-volatile memory that can be written and erased multiple times, and is used for solid information retention of a chip, initial setting, fine adjustment of characteristics, or the like. In the MTP, an electrical state of a floating gate (FG) is changed by entrance and exit of electrons to and from the electrically insulated FG to operate as a memory.

SUMMARY

Some embodiments of the present disclosure provide a non-volatile semiconductor memory device having excellent data retention characteristics.

According to one embodiment of the present disclosure, there is provided a non-volatile semiconductor memory device, comprising: a semiconductor substrate; a first insulating layer disposed on the semiconductor substrate; a first conductive layer disposed on the first insulating layer and constituting a first floating gate of one of memory cells adjacent to each other; a second conductive layer disposed on the first insulating layer and constituting a second floating gate of the other one of the memory cells adjacent to each other; a third insulating layer covering the first conductive layer and the second conductive layer; and a fourth insulating layer disposed on the third insulating layer, wherein electric charges are held in each of the first conductive layer and the second conductive layer electrically insulated by separating the fourth insulating layer in distance from the first conductive layer and the second conductive layer.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a diagram illustrating operating parameters of respective parts in FIG. 1, in which an example of voltages applied to respective wirings during a data write operation, a data read operation, and a data erase operation is shown.

DETAILED DESCRIPTION

Figure 1:
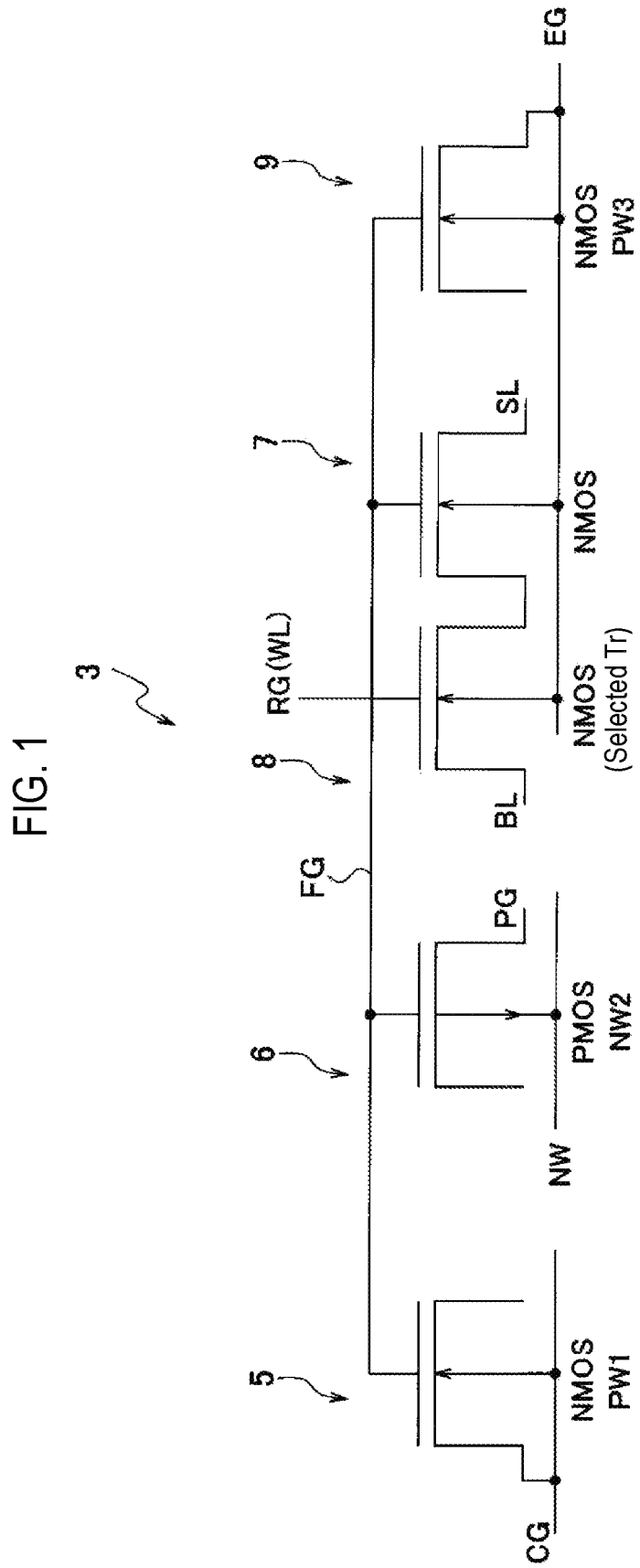
FIG. 1 is a schematic equivalent circuit configuration diagram of a memory cell of a non-volatile semiconductor memory device according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the present disclosure will now be described with reference to the drawings. In the following description of the drawings, like or similar parts are denoted by like or similar reference numerals. However, it should be noted that the drawings are schematic and that the relationships between thicknesses and plan dimensions, and the like of respective components are different from those of reality. Therefore, specific thicknesses or dimensions should be determined in consideration of the following description. Further, parts having different dimensional relationships or ratios may be included among the drawings.

Further, the embodiments described below are presented to illustrate apparatuses or methods for embodying the technical concept of the present disclosure and are not intended to specify materials, features, structures, arrangements, and the like of the components. The embodiments may be variously modified within the scope of the accompanying claims.

Embodiment (Circuit Configuration of Non-volatile Semiconductor Memory Device)

A schematic equivalent circuit configuration of a memory cell 3 of a non-volatile semiconductor memory device according to an embodiment of the present disclosure is illustrated in FIG. 1. The non-volatile semiconductor memory device according to the present embodiment is a non-volatile memory (MTP), which can be written and erased multiple times and in which an electrical state of a floating gate (FG) is changed by entrance and exit of electrons to and from the electrically insulated FG to operate as a memory.

As illustrated in FIG. 1, the memory cell 3 includes a coupling capacitor 5, a program transistor 6, a read transistor 7, a switch transistor 8, and an erase capacitor 9, in which the coupling capacitor 5, the program transistor 6, the read transistor 7, and the erase capacitor 9 share one floating gate FG.

The coupling capacitor 5 is formed in a P-type well PW1. A coupling gate line CG is connected to the well PW1 via a high-concentration N-type diffusion layer (not shown). A potential of the coupling gate line CG is transferred to the well PW1 and further transferred to the floating gate FG by capacitive coupling.

A capacitive coupling ratio α between the floating gate FG of the coupling capacitor 5 and the well PW1 to a total of a capacitance between the floating gate FG of the coupling capacitor 5 and the well PW1, a capacitance between the floating gate FG of the program transistor 6 and an N-type well NW2, a capacitance between the floating gate FG of the erase capacitor 9 and a well PW3, and a capacitance between the floating gate FG of the read transistor 7 and the well PW3 may be set to exceed 0.9.

The potential transferred to the floating gate FG is expressed by $\alpha \times V_{CG}$. If α is set to exceed 0.9, most of the potential $V_{CG}$ of the coupling gate line CG is transferred to the floating gate FG. In order to simplify the description, it is assumed below that α is set to approximately 1 and the potential $V_{CG}$ of the coupling gate line CG is transferred to the floating gate FG by capacitive coupling to allow the potential of the floating gate FG to become $V_{CG}$.

The program transistor 6 includes a P-type field effect transistor (MOSFET) formed in the well NW2. In the program transistor 6, a write bit line PG is connected to a high-concentration P-type diffusion layer which is a source and a drain. In addition, a predetermined voltage is applied from a substrate voltage line NW to the well NW2 in which the program transistor 6 is formed.

The erase capacitor 9 is formed in the well PW3 different from the well PW1 in which the coupling capacitor 5 is formed. An erase gate line EG is connected to the well PW3 via a high-concentration N-type diffusion layer. A potential of the erase gate line EG is transferred to the well PW3. If the capacitive coupling ratio α is set to exceed 0.9, since the capacitance ratio between the floating gate FG of the erase capacitor 9 and the well PW3 to the sum of the capacitance between the floating gate FG of the coupling capacitor 5 and the well PW1, the capacitance between the floating gate FG of the program transistor 6 and the well NW2, the capacitance between the floating gate FG of the erase capacitor 9 and the well PW3, and the capacitance between the floating gate FG of the read transistor 7 and the well PW3 is 0.1 or less, a potential transferred from the erase gate line EG to the floating gate FG may be ignored.

The read transistor 7 includes an N-type MOSFET formed in the well PW3 in which the erase capacitor 9 is formed. The read transistor 7 has a configuration in which one of a source and a drain thereof is connected to one of a source and a drain of the switch transistor 8, and the switch transistor 8 is connected in series thereto. In addition, a source line SL is connected to a high-concentration N-type diffusion layer of the other one of the source and the drain of the read transistor 7.

The switch transistor 8 includes an N-type MOSFET formed in the well PW3 in which the erase capacitor 9 is formed. In the switch transistor 8, a read bit line BL is connected to a high-concentration N-type diffusion layer of the other one of the source and the drain thereof, and a switch gate line RG is connected to a gate thereof. The switch gate line RG may be referred to as a word line WL. The switch transistor 8 can electrically connect or disconnect the read bit line BL and the read transistor 7 by an ON/OFF operation.

An example of voltages applied to the respective wirings during a data write operation, a data read operation, and a data erase operation, and describing operating parameters of the respective parts in FIG. 1, is illustrated in FIG. 2.

Figure 3:
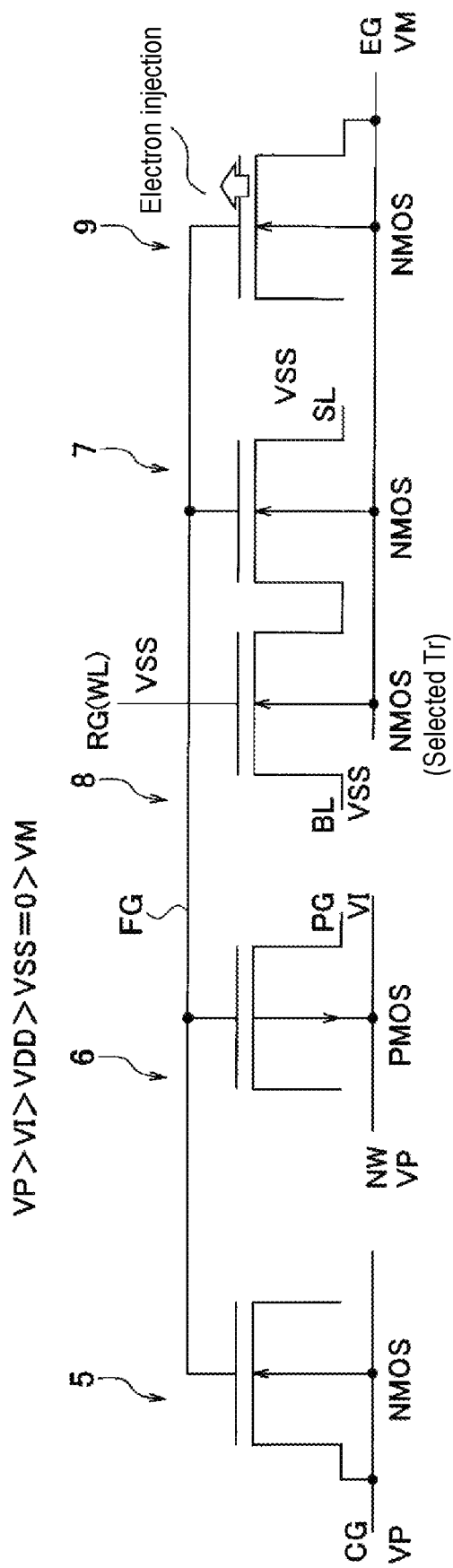
FIG. 3 is an explanatory diagram of an erase operation of the memory cell of the non-volatile semiconductor memory device according to the present embodiment.
Figure 4:
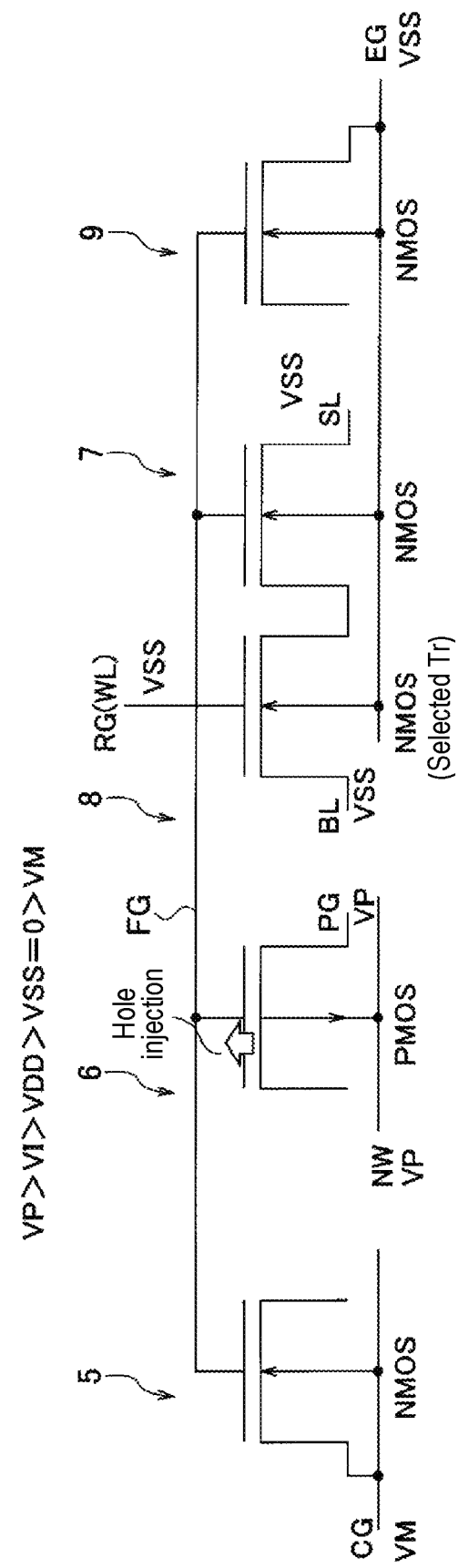
FIG. 4 is an explanatory diagram of a write operation of the memory cell of the non-volatile semiconductor memory device according to the present embodiment.
Figure 5:
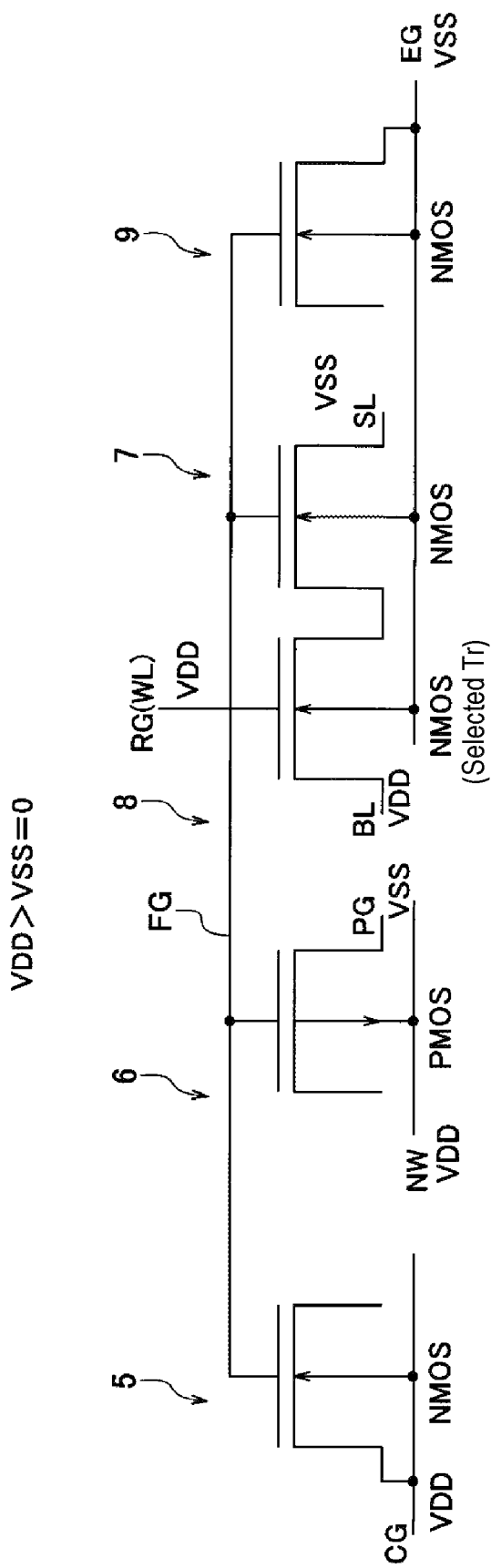
FIG. 5 is an explanatory diagram of a read operation of the memory cell of the non-volatile semiconductor memory device according to the present embodiment.

An erase operation description of the memory cell 3 is illustrated in FIG. 3, a write (program) operation description thereof is illustrated in FIG. 4, and a read operation description thereof is illustrated in FIG. 5.

(Data Erase Operation Mode_FIG. 3)

In a data erase operation mode, as illustrated in FIGS. 2 and 3, a VI (for example, an intermediate voltage of about 5 V) is applied to the write bit line PG, a VSS is applied to the read bit line BL, a VP is applied to the coupling gate line CG, the VP is applied to the substrate voltage line NW, the VSS is applied to the switch gate line RG, the VSS is applied to the source line SL, and a VM is applied to the erase gate line EG. In this case, a magnitude relationship of the respective voltages is expressed by VP>VI>VDD>VSS=0>VM.

During the data erase operation, the voltage VP (for example, a high voltage of about 10 V) is applied to the coupling gate line CG. The voltage VI (intermediate voltage) is applied to the write bit line PG. The voltage VSS (for example, 0 V) is applied to the read bit line BL and the source line SL. Thus, the potential of the well PW1 becomes a value close to the voltage VP, and the potential of the floating gate FG becomes the voltage VP by capacitive coupling. The voltage VM (negative voltage) is applied to the erase gate line EG to allow the potential of the well PW3 to become the voltage VM. Thus, electrons are injected from the well PW3 equal to the potential of the erase gate line EG to the floating gate FG by tunnel effect, due to a potential difference between the floating gate FG and the well PW3 (electron injection).

(Data Write Operation Mode_FIG. 4)

In a data write operation mode, as illustrated in FIGS. 2 and 4, a VP is applied to the write bit line PG of a selected memory cell 3, a VSS is applied to the read bit line BL, a VM is applied to the coupling gate line CG, the VP is applied to the substrate voltage line NW, the VSS is applied to the switch gate line RG, the VSS is applied to the source line SL, and the VSS is applied to the erase gate line EG. In addition, a VI is applied to the write bit line PG of a non-selected memory cell 3, the VSS is applied to the read bit line BL, the VI is applied to the coupling gate line CG, the VP is applied to the substrate voltage line NW, the VSS is applied to the switch gate line RG, the VSS is applied to the source line SL, and the VSS is applied to the erase gate line EG. In this case, the magnitude relationship of the respective voltages is expressed by VP>VI>VDD>VSS=0>VM.

During the data write operation, the voltage VM (minus voltage) is applied to the coupling gate line CG to which the memory cell 3 selected for data writing is connected. Thus, the potential of the well PW1 of the memory cell row including the memory cell selected for writing becomes the voltage VM, and the potential of the floating gate FG becomes a value close to the voltage VM by capacitive coupling.

A positive high voltage VP (high voltage) is applied from a write bit line control circuit 150 (see FIG. 18) to the write bit line PG to which the memory cell 3 selected for writing is connected. Thus, a potential of a channel of the program transistor 6 of the memory cell column including the memory cell 3 selected for writing becomes the voltage VP. In the program transistor 6 of the memory cell 3 selected for writing, electric charges (holes) are injected to the floating gate FG by tunnel effect, due to a potential difference between the floating gate FG whose potential becomes a value close to the voltage VM and the channel of the voltage VP (hole injection).

(Data Read Operation Mode_FIG. 5)

In a data read operation mode, as illustrated in FIGS. 2 and 5, a VSS is applied to the write bit line PG of a selected memory cell 3, a VDD is applied to the read bit line BL, the VDD is applied to the coupling gate line CG, the VDD is applied to the substrate voltage line NW, the VDD is applied to the switch gate line RG, the VSS is applied to the source line SL, and the VSS is applied to the erase gate line EG. In addition, the VSS is applied to the write bit line PG of a non-selected memory cell 3, the VSS is applied to the read bit line BL, the VDD is applied to the coupling gate line CG, the VDD is applied to the substrate voltage line NW, the VSS is applied to the switch gate line RG, the VSS is applied to the source line SL, and the VSS is applied to the erase gate line EG. In this case, the magnitude relationship of the respective voltages is expressed by VDD>VSS=0.

For example, when reading data from the memory cell 3, the power source voltage VDD is applied to the read bit line BL to which the memory cell 3 for data reading is connected. The power source voltage VDD is applied to the switch gate line RG connected to the memory cell 3 selected for reading. Thus, the switch transistor 8 of the memory cell 3 selected for reading is turned on, and the read transistor 7 and the bit line BL for reading are electrically connected.

Further, in the aforementioned embodiment, the memory cell 3 having the erase capacitor 9 has been described, but the present disclosure is not limited thereto and a memory cell having no erase capacitor may be used. In addition, as another embodiment, transistors in which N-type and P-type conductivity types of the coupling capacitor 5, the program transistor 6, the read transistor 7, the switch transistor 8, and the erase capacitor 9, which constitute the memory cell, are reversed may be used.

(Configuration of Non-Volatile Semiconductor Memory Device)

Figure 6:
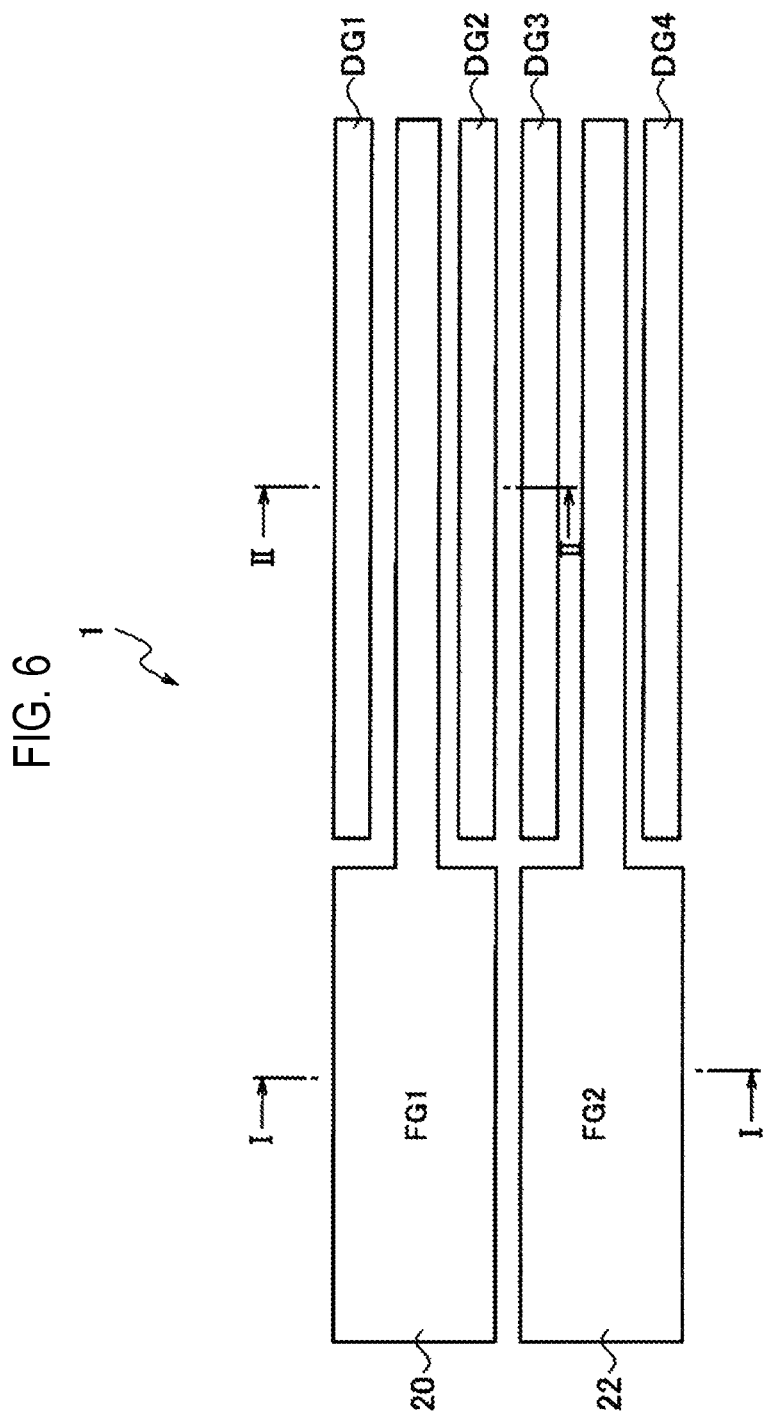
FIG. 6 is a schematic plan pattern configuration diagram of the non-volatile semiconductor memory device according to the present embodiment.
Figure 7:
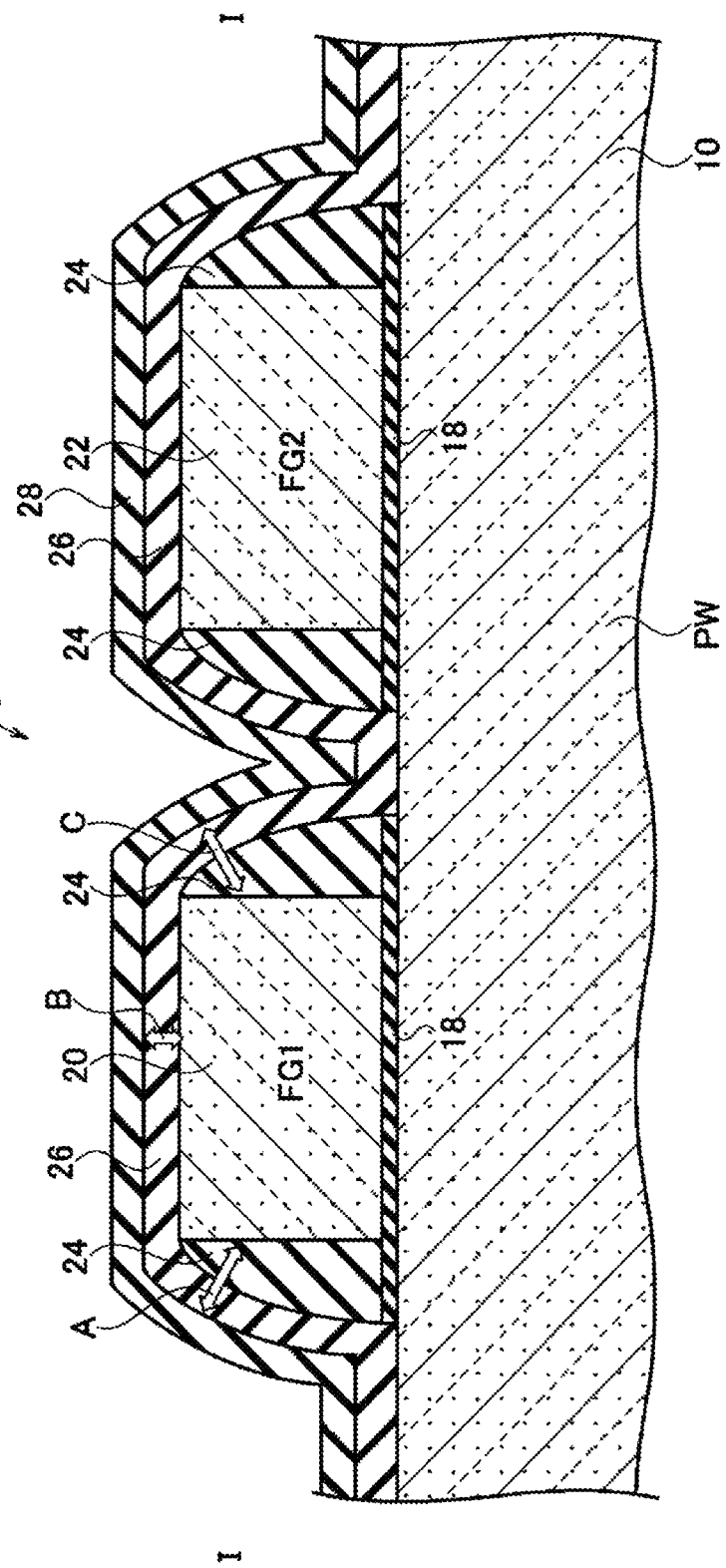
FIG. 7 is a schematic cross-sectional structural diagram taken along line I-I in FIG. 6.

A schematic plan pattern configuration of the non-volatile semiconductor memory device 1 according to the present embodiment is illustrated in FIG. 6, and a schematic cross-sectional structure taken along line I-I in FIG. 6 is illustrated in FIG. 7.

As illustrated in FIG. 7, the non-volatile semiconductor memory device 1 according to the present embodiment includes a semiconductor substrate 10, a first insulating layer 18 disposed on the semiconductor substrate 10, a first conductive layer 20 disposed on the first insulating layer 18 and constituting a first floating gate FG1 of one of memory cells adjacent to each other, a second conductive layer 22 disposed on the first insulating layer 18 and constituting a second floating gate FG2 of the other one of the memory cells adjacent to each other, a third insulating layer 26 covering the first conductive layer 20 and the second conductive layer 22, and a fourth insulating layer 28 disposed on the third insulating layer 26. In this case, electric charges can be held in each of the first conductive layer 20 and the second conductive layer 22 electrically insulated by separating the fourth insulating layer 28 from the first conductive layer 20 and the second conductive layer 22. The semiconductor substrate 10 may be, for example, a P-type well PW. In addition, as illustrated in FIG. 7, a second insulating layer 24 disposed on sidewall portions of the first conductive layer 20 and the second conductive layer 22 may be further included.

The memory cells adjacent to each other each include the coupling capacitor 5, the program transistor 6, the read transistor 7, the erase capacitor 9, and the switch transistor 8, in which one of the source and the drain thereof is connected to one of the source and the drain of the read transistor 7 and connected in series to the read transistor 7, as illustrated in FIG. 1. The program transistor 6, the coupling capacitor 5, the read transistor 7, and the erase capacitor 9 share the floating gate FG. The memory cells adjacent to each other operate the first conductive layer 20 and the second conductive layer 22 as the respective floating gates FG1 and FG2.

Further, the first conductive layer 20 may include a first polysilicon layer, the second conductive layer 22 may include a second polysilicon layer, the first insulating layer 18 may include a gate oxide film, the second insulating layer may include a silicon nitride film, the fourth insulating layer may include a contact etch stop nitride film, and the third insulating layer may include a salicide block oxide film.

In this case, the electric charges held by the first conductive layer 20 and the second conductive layer 22 are easily influenced by electric charges from the surroundings, for example, by electric charges in the fourth insulating layer 28. Therefore, the fourth insulating layer 28 may be separated from the first conductive layer 20 and the second conductive layer 22 to provide the non-volatile semiconductor memory device that avoids the influence of electric charges in the fourth insulating layer 28 and has excellent data retention characteristics.

Further, the first conductive layer 20 and the second conductive layer 22 may be separated from each other to provide the non-volatile semiconductor memory device that avoids the influence of electric charges between the first conductive layer 20 and the second conductive layer 22 and has excellent data retention characteristics.

As a subject of a portion separating the fourth insulating layer 28 and the first conductive layer 20, there is a portion between the sidewall portion of the first conductive layer 20 and the fourth insulating layer 28 covering the first conductive layer 20, as indicated by an arrow A in FIG. 7. Further, as indicated by an arrow B in FIG. 7, there is a portion between a flat portion of the first conductive layer 20 and the fourth insulating layer 28 covering the first conductive layer 20. In addition, as indicated by an arrow C in FIG. 7, there is a portion between the sidewall portion of the first conductive layer 20 and the fourth insulating layer 28 covering the first conductive layer 20 between the first conductive layer 20 and the second conductive layer 22 of another adjacent memory cell.

In the operation of the MTP, the retention characteristics (retention) of electric charges are one of important factors. For example, an electrically erasable and programmable read only memory (EEPROM) has a two-layer structure of the coupling gate CG and the floating gate FG, and therefore there is no influence of electric charges from the surroundings on the FG by an influence of a shield structure of CG-FG. On the other hand, since the non-volatile semiconductor memory device according to the present embodiment, which is a non-volatile memory (MTP) that can be written and erased multiple times, has a single conductive layer (single-layer polysilicon gate) structure, it is likely to be influenced by electric charges from the surroundings, but the non-volatile semiconductor memory device 1 according to the present embodiment has an FG structure with high data retention characteristics.

It has been experimentally confirmed that the existence of electric charges in SiN (nitride film) greatly influences data retention, and therefore, the fourth insulating layer 28 may be separated from the first conductive layer 20 and the second conductive layer 22. As illustrated in FIG. 7, the non-volatile semiconductor memory device 1 according to the present embodiment has a configuration in which adjacent portions are reduced by separating the first conductive layer (FG1) 20, the second conductive layer (FG2) 22, and the fourth insulating layer (SiN) 28 from each other.

The MTP is a non-volatile semiconductor memory device having a single-layer polysilicon gate structure, and can be easily manufactured by a complementary metal-oxide-semiconductor (CMOS) process.

The non-volatile semiconductor memory device according to the present embodiment having a single-layer polysilicon gate structure is compatible with the CMOS process, and thus can form a memory cell similar to a general MOSFET.

Since the EEPROM has a two-layer polysilicon structure of CG-FG, a process specialized for the two-layer polysilicon structure of CG-FG is required for forming a memory cell.

Further, since the non-volatile semiconductor memory device 1 according to the present embodiment has a cross-sectional configuration similar to that of CMOS, it can be combined with CMOS LSI and can easily apply an embedded technique, like a general MOS technique.

Moreover, when comparing degrees of deterioration, in the non-volatile semiconductor memory device according to the present embodiment having a single-layer polysilicon gate structure, entrance and exit of electric charges to and from the floating gate FG are different. In the EEPROM having a two-layer polysilicon structure of CG-FG, since the same oxide film part is used for the entrance and exit of electric charges, the degree of deterioration of the oxide film is large. In the non-volatile semiconductor memory device according to the present embodiment having a single-layer polysilicon gate structure, since the entrance and exit of electric charges to and from the floating gate FG is different and the locations of electron injection and hole injection are different, the degree of deterioration of the oxide film is relatively low. That is, in the non-volatile semiconductor memory device according to the present embodiment having the single-layer polysilicon gate structure, since passing regions of electric charges are different in the write/read operations, the deterioration of the oxide film can be suppressed. Thus, it is possible to lengthen the storage retention time by storing electric charges for a long period of time, and to improve the reliability.

On the other hand, in the non-volatile semiconductor memory device according to the present embodiment, a size of the FG in a longitudinal direction is, for example, about 14 μm, which is about 4 times that of the EEPROM having a two-layer polysilicon structure and is large in memory cell area.

Further, in the non-volatile semiconductor memory device according to the present embodiment, a thickness of the oxide film is, for example, about 13 nm, which is approximately equal to a thickness of the oxide film of the CMOS of 5V operation. In the case of applying the CMOS technique of 3V operation, the thickness of the oxide film is, for example, about 2 nm. In both cases, the electron injection and the hole injection passing through the oxide film can be conducted by Fowler-Nordheim (FN) tunnel conduction.

In the non-volatile semiconductor memory device according to the present embodiment, an influence of parasitic capacitance in the surroundings can be suppressed by increasing the distance from FG-SiN. Further, in a laminated structure of FG (20)-oxide film (26)-SiN (28), the influence of the SiN (28) film on the FG (20) can be suppressed. In addition, the influence of the oxide film (26) on the FG (20) can be suppressed.

(Dummy Gate Structure)

Figure 8:
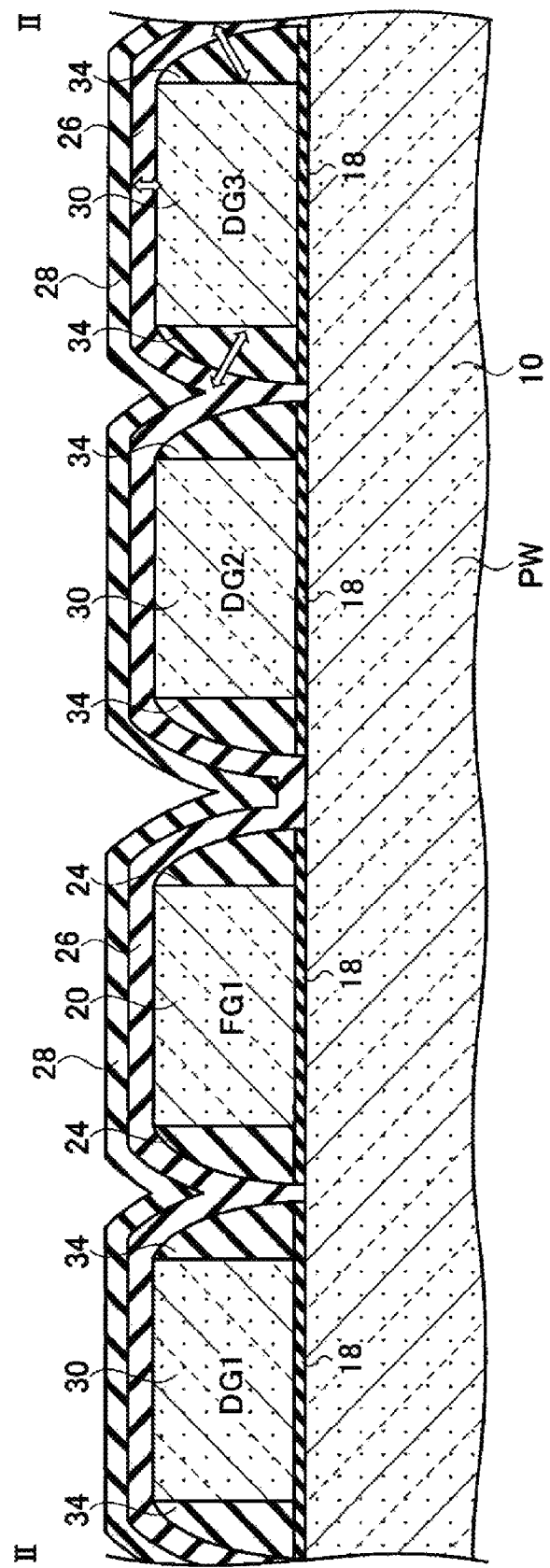
FIG. 8 is a schematic cross-sectional structural diagram taken along line II-II in FIG. 6, wherein an example in which a dummy gate (DG) structure is provided adjacent to relatively narrow FGs of adjacent memory cells is shown.

Further, a schematic cross-sectional structural diagram taken along line II-II in FIG. 6 is illustrated in FIG. 8, wherein an example in which a dummy gate DG structure is provided adjacent to relatively narrow floating gates FGs of adjacent memory cells is shown.

In the plan pattern configuration example illustrated in FIG. 6, dummy gates DG1 and DG2 are arranged adjacent to a relatively narrow floating gate FG1, and dummy gates DG3 and DG4 are arranged adjacent to a relatively narrow floating gate FG2.

The non-volatile semiconductor memory device 1 according to the present embodiment may include a third polysilicon layer DG1 disposed adjacent to the first polysilicon layer (FG1) 20 in a direction orthogonal to the longitudinal direction in a plan view, as illustrated in FIG. 6. In this case, the third polysilicon layer (DG1) 30 is disposed on the first insulating layer 18, and is covered with the third insulating layer 26 and the fourth insulating layer 28 disposed on the third insulating layer 26, as illustrated in FIG. 8.

Similarly, the non-volatile semiconductor memory device 1 according to the present embodiment may include a fourth polysilicon layer DG2 disposed adjacent to the first polysilicon layer (FG1) 20 in the direction orthogonal to the longitudinal direction in the plan view, and also disposed so as to face the third polysilicon layer DG1, with the first polysilicon layer (FG1) 20 interposed therebetween, as illustrated in FIG. 6. In this case, the fourth polysilicon layer (DG2) 30 is disposed on the first insulating layer 18, and is covered with the third insulating layer 26 and the fourth insulating layer 28 disposed on the third insulating layer 26, as illustrated in FIG. 8.

Figure 9:
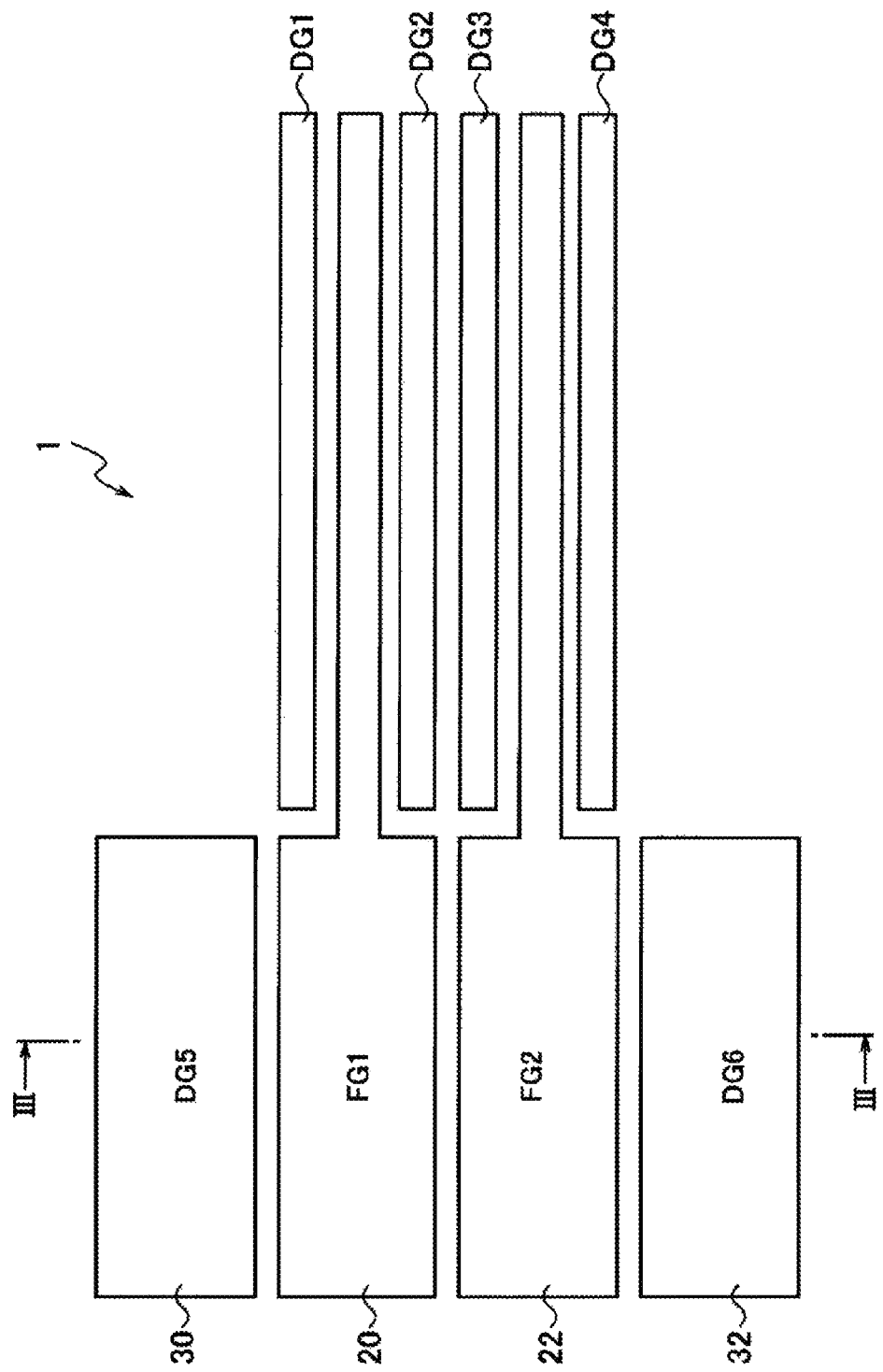
FIG. 9 is another schematic plan pattern configuration diagram of the non-volatile semiconductor memory device according to the present embodiment.
Figure 10:
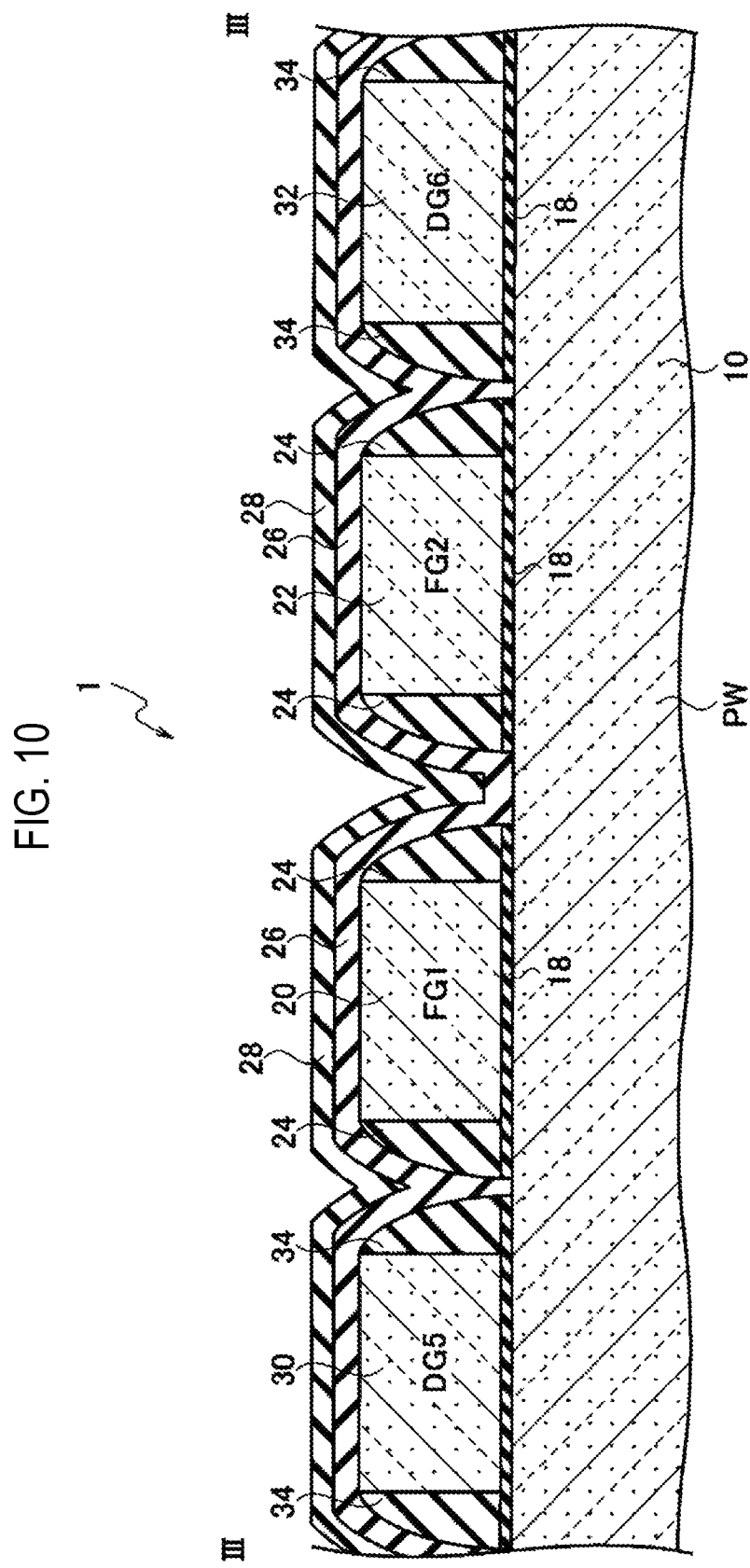
FIG. 10 is a schematic cross-sectional structural diagram taken along line III-III in FIG. 9, wherein an example in which a dummy gate (DG) structure is provided adjacent to relatively wide FGs of adjacent memory cells is shown.

Another schematic plan pattern configuration of the non-volatile semiconductor memory device according to the present embodiment is illustrated in FIG. 9, and an example which is a schematic cross-sectional structural diagram taken along line III-III in FIG. 9 and in which a dummy gate (DG) structure is provided adjacent to relatively wide FGs of adjacent memory cells is illustrated in FIG. 10.

In the plan pattern configuration example illustrated in FIG. 9, a dummy gate DG5 is arranged adjacent to a relatively wide floating gate FG1, and a DG6 is arranged adjacent to a relatively wide floating gate FG2. Further, similar to the plan pattern configuration example illustrated in FIG. 6, dummy gates DG1 and DG2 are arranged adjacent to the relatively narrow floating gate FG1, and dummy gates DG3 and DG4 are arranged adjacent to the relatively narrow floating gate FG2.

The non-volatile semiconductor memory device 1 according to the present embodiment may include a fifth polysilicon layer DG5 disposed adjacent to the first polysilicon layer (FG1) 20 in a direction orthogonal to the longitudinal direction in the plan view, as illustrated in FIG. 9. In this case, as illustrated in FIG. 10, the fifth polysilicon layer (DG5) 30 is disposed on the first insulating layer 18, and is covered with the third insulating layer 26 and the fourth insulating layer 28 disposed on the third insulating layer 26.

Similarly, the non-volatile semiconductor memory device 1 according to the present embodiment may include a sixth polysilicon layer DG6 disposed adjacent to the second polysilicon layer (FG2) 22 in the direction orthogonal to the longitudinal direction in the plan view, and also disposed so as to face the fifth polysilicon layer DG5, with the second polysilicon layer (FG2) 22 interposed therebetween, as illustrated in FIG. 9. In this case, the sixth polysilicon layer (DG6) 32 is disposed on the first insulating layer 18, and is covered with the third insulating layer 26 and the fourth insulating layer 28 disposed on the third insulating layer 26, as illustrated in FIG. 10.

In the non-volatile semiconductor memory device according to the present embodiment, the SiN and the FGs can be separated from each other in the lateral direction of the FGs by arranging the dummy gate DG structure (dummy polysilicon) around the FGs, thereby suppressing the influence of parasitic capacitance in the surroundings. Further, the influence of the SiN (28) film on the FG (20) can be suppressed by arranging the dummy gate DG structure in a laminated structure of FG (20)-oxide film (26)-SiN (28).

(Void Structure)

Figure 11:
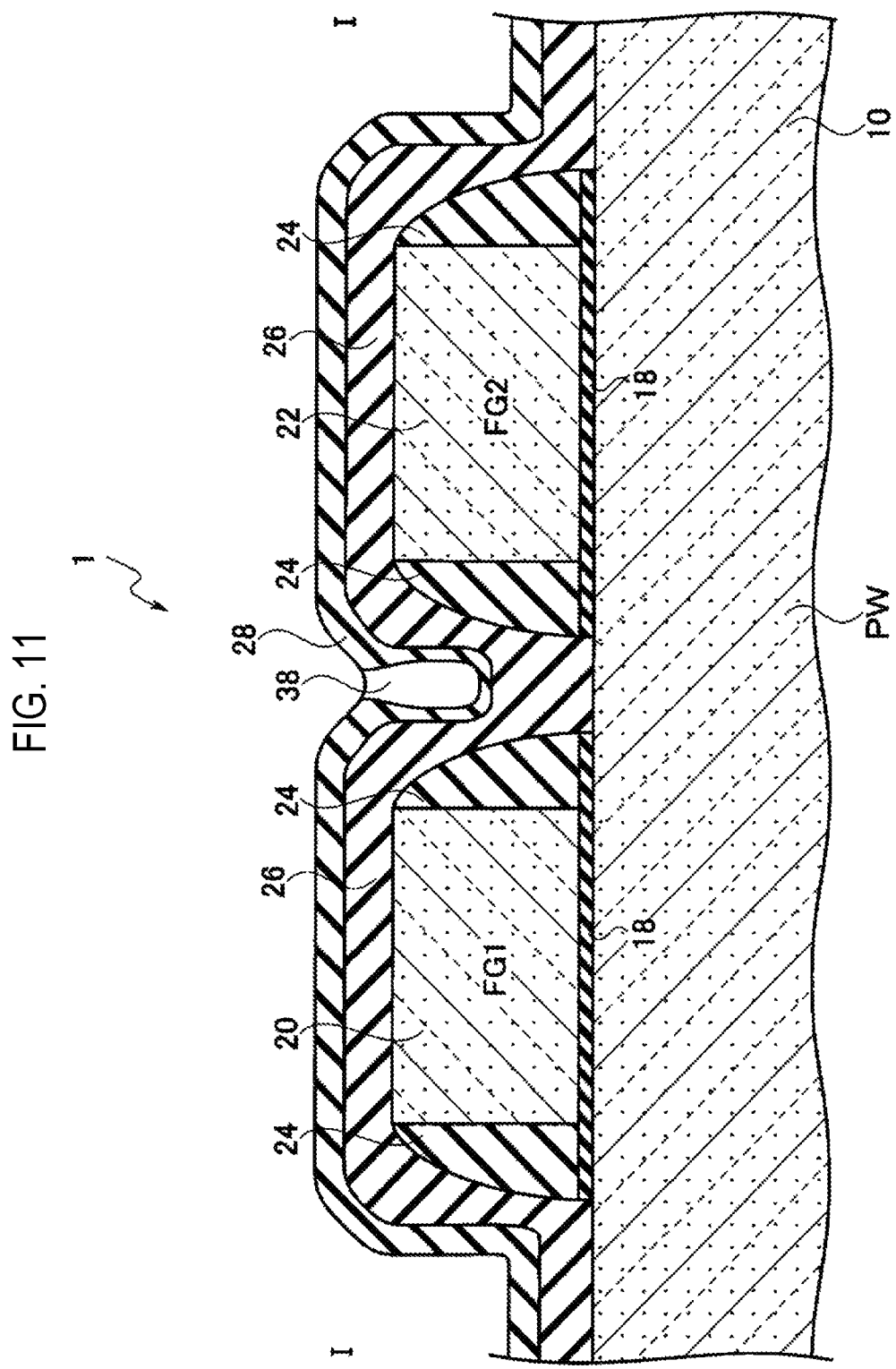
FIG. 11 is a schematic cross-sectional structural diagram of an example in which a void structure is provided between relatively wide FGs of adjacent memory cells in the non-volatile semiconductor memory device according to the present embodiment.

A schematic cross-sectional structure of an example in which a void structure is provided between relatively wide FGs of adjacent memory cells in the non-volatile semiconductor memory device according to the present embodiment is illustrated in FIG. 11.

Figure 12:
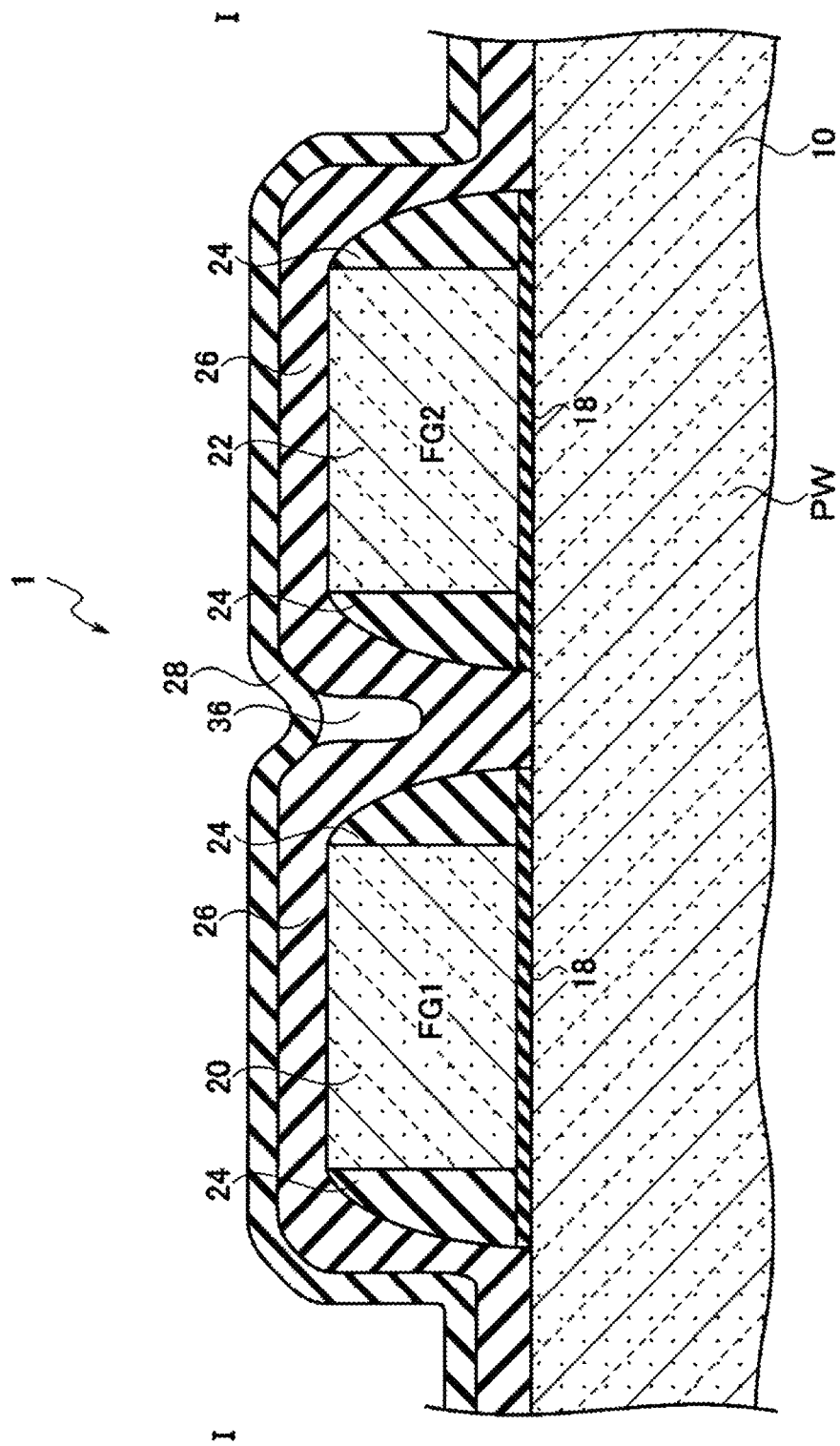
FIG. 12 is a schematic cross-sectional structural diagram of another example in which a void structure is provided between relatively wide FGs of adjacent memory cells in the non-volatile semiconductor memory device according to the present embodiment.

Further, a schematic cross-sectional structure of another example in which a void structure is provided between relatively wide FGs of adjacent memory cells in the non-volatile semiconductor memory device according to the present embodiment is illustrated in FIG. 12. FIGS. 11 and 12 both correspond to the schematic cross-sectional structure taken along line I-I in FIG. 6.

The non-volatile semiconductor memory device 1 according to the present embodiment may include an air gap region 38 between the first polysilicon layer 20 and the second polysilicon layer 22, as illustrated in FIG. 11.

Further, as illustrated in FIG. 11, the air gap region 38 may be arranged on the fourth insulating layer 28 disposed between the first polysilicon layer 20 and the second polysilicon layer 22.

The non-volatile semiconductor memory device 1 according to the present embodiment may include an air gap region 36 between the first polysilicon layer 20 and the second polysilicon layer 22, as illustrated in FIG. 12.

Further, as illustrated in FIG. 12, the air gap region 36 may be arranged between the third insulating layer 26 and the fourth insulating layer 28 disposed between the first polysilicon layer 20 and the second polysilicon layer 22.

In an example in which the relatively narrow FG1 and FG2 are arranged adjacent to each other, it is easy to fill a space between the FG1 and the FG2 with the third insulating layer 26 and the fourth insulating layer 28 when a distance between the FG1 and the FG2 is large.

On the other hand, in the example in which the relatively wide FG1 and FG2 are arranged adjacent to each other, when compared with the same distance between the FG1 and the FG2, it is difficult to fill the space between the FG1 and the FG2 with the third insulating layer 26 and the fourth insulating layer 28 when widths of the FG1 and the FG2 are large, and in the case of a minimum space, there is a tendency to easily form a void only here. That is, if the third insulating layer 26 and the fourth insulating layer 28 are laminated in the same space, it is more difficult to fill the space when line widths of the FG1 and the FG2 are large. For example, as an example of a numerical value, in a line width L and a space S, a tendency to easily generate a void at L/S=0.56 μm/0.21 μm is observed.

Prototype Structure Example

Figure 13:
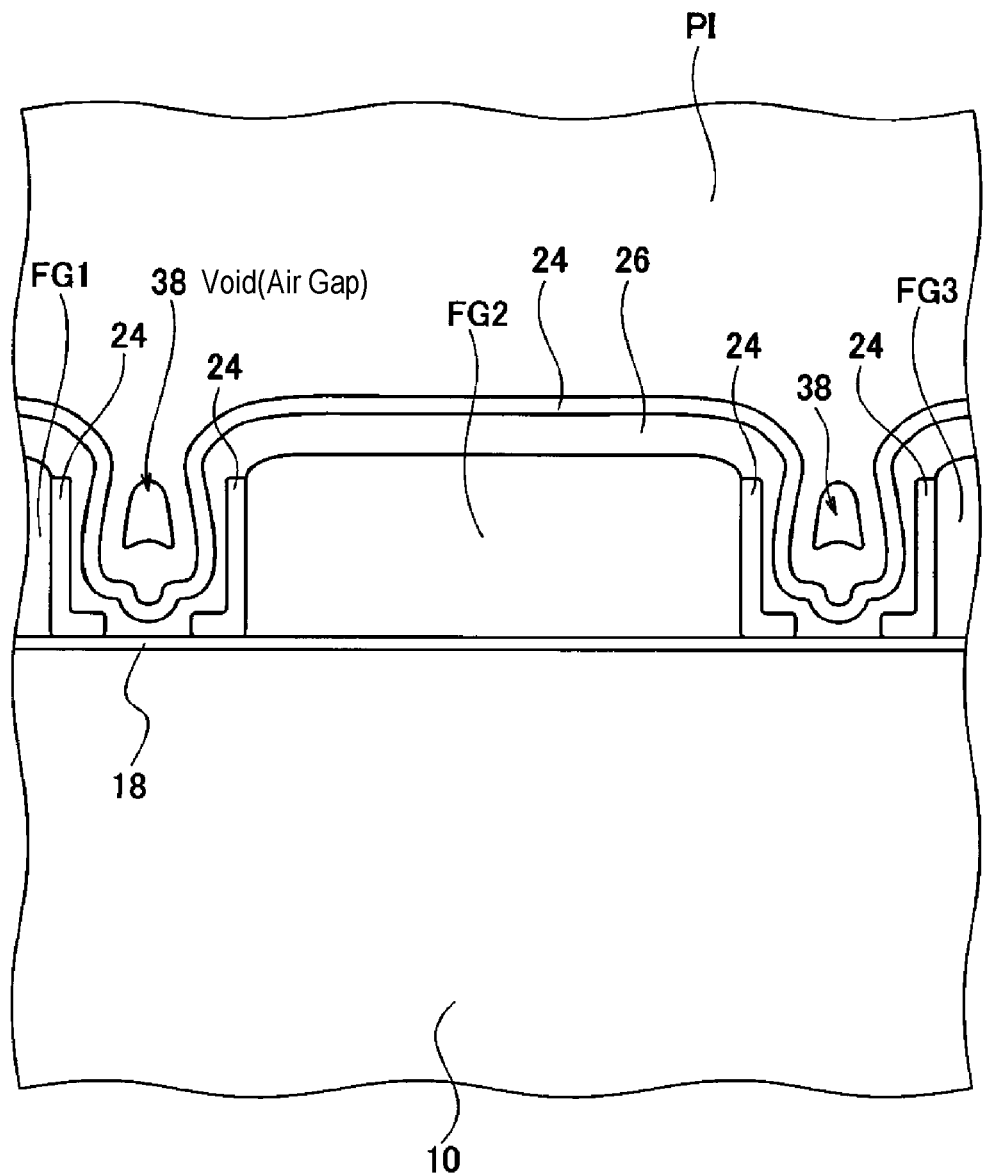
FIG. 13 is a cross-sectional structure example of a structure having voids between FGs of adjacent memory cells in the non-volatile semiconductor memory device according to the present embodiment.
Figure 15:
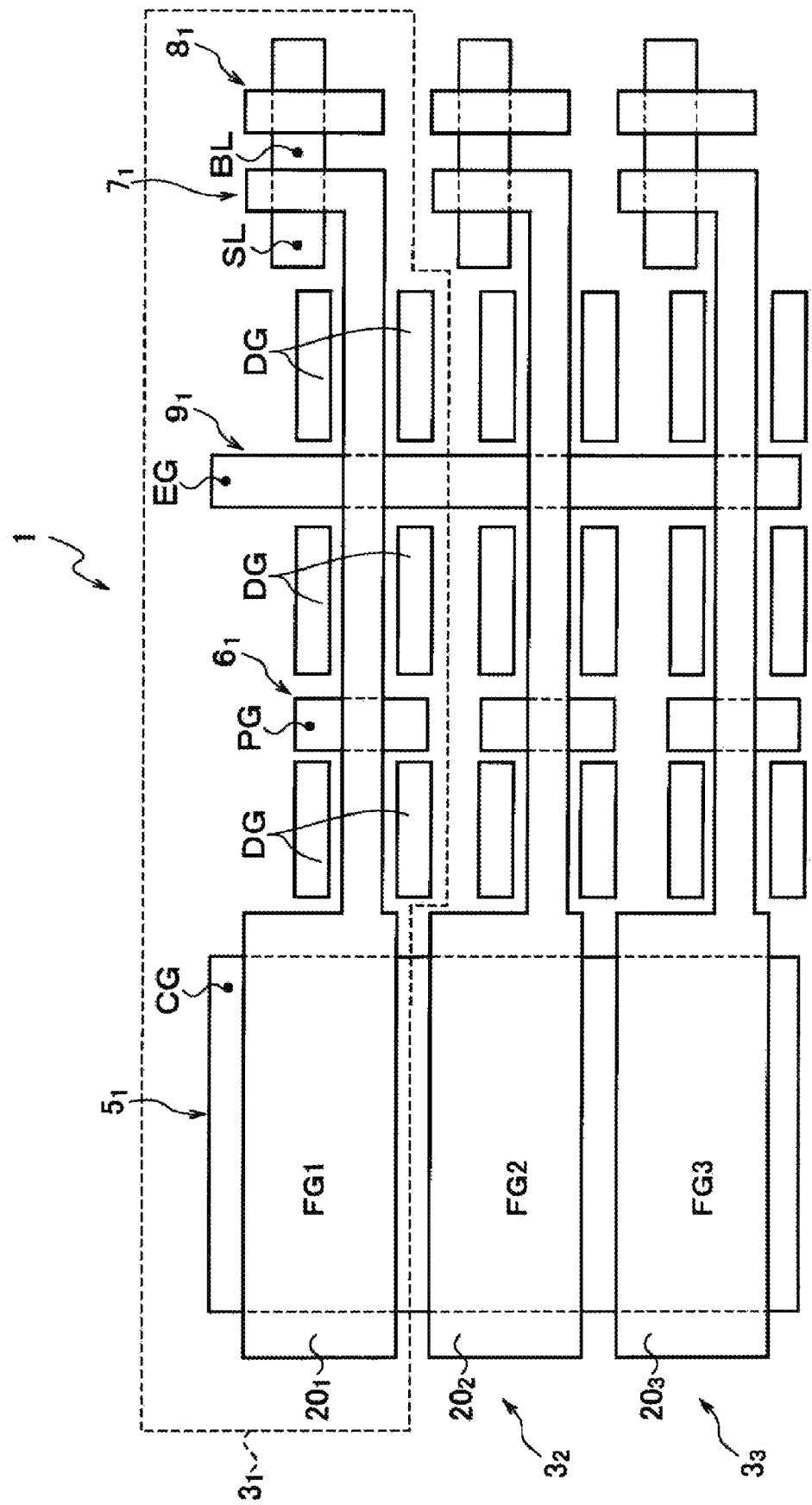
FIG. 15 is a schematic plan pattern configuration diagram of FGs, dummy gates DGs, and active regions of three adjacent memory cells in the non-volatile semiconductor memory device according to the present embodiment.

A cross-sectional structure example of a structure having voids between FGs of adjacent memory cells in the non-volatile semiconductor memory device according to the present embodiment is illustrated in FIG. 13. The structure example of FIG. 13 corresponds to an example in which relatively wide FG1, FG2, and FG3 are arranged adjacent to each other. For example, as illustrated in FIG. 15, this corresponds to an example in which voids are provided between the adjacent FG1 and FG2 and between the adjacent FG2 and FG3 in patterns of adjacent memory cells $3_1$, $3_2$, and $3_3$. As illustrated in FIG. 13, voids 38 each have a structure that gradually expands in a surface direction of the substrate 10 and also have a structure which stops expanding at substantially intermediate portions of thicknesses of the FG1, FG2, and FG3 and is pulled back by a notch portion. Further, a height of an upper leading portion of the void 38 from the surface of the substrate is formed lower than heights of upper surface portions of the FG1, FG2, and FG3 from the surface of the substrate. In addition, shapes of second insulating layers 24 formed on sidewall portions of the FG1, FG2, and FG3 have, for example, an L-shape or an L-shaped symmetrical structure. Further, the device surface portion is covered with an interlayer insulating film such as polyimide PI.

Figure 14:
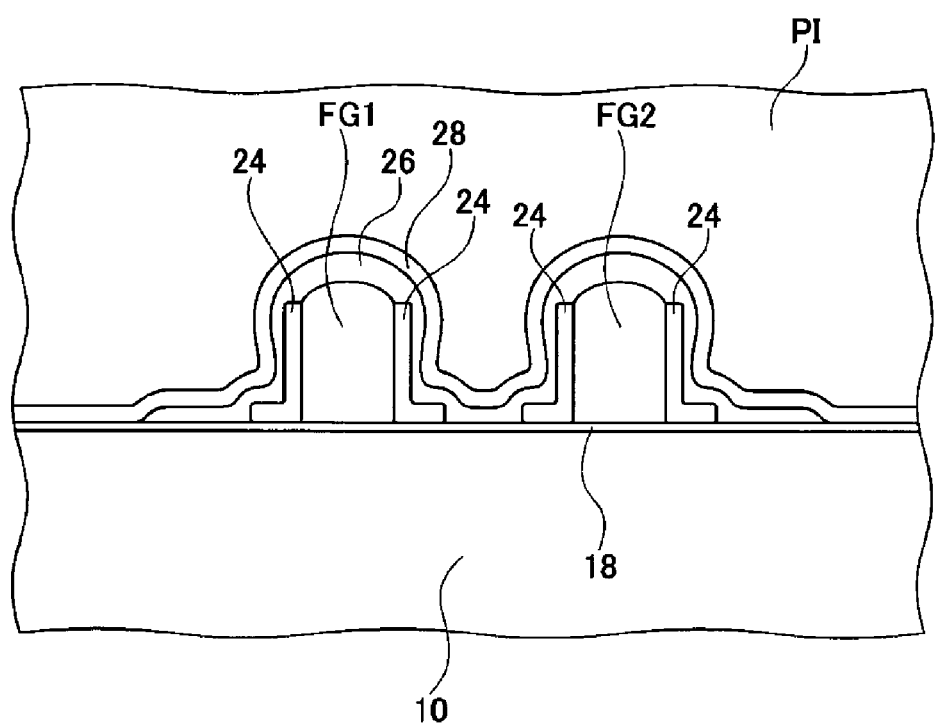
FIG. 14 is a cross-sectional structure example of a structure having no void between FGs of adjacent memory cells in the non-volatile semiconductor memory device according to the present embodiment.

Further, a cross-sectional structure example of a structure having no void between FGs of adjacent memory cells in the non-volatile semiconductor memory device according to the present embodiment is illustrated in FIG. 14. The structure example of FIG. 14 is an example in which relatively narrow FG1 and FG2 are arranged adjacent to each other, there is a distance between the FG1 and the FG2, and a space between the FG1 and the FG2 is filled with the third insulating layer 26 and the fourth insulating layer 28. As illustrated in FIG. 14, since the relatively narrow FG1 and FG2 are arranged at a separated distance, there is no void between the FG1 and the FG2. Further, the shape of the second insulating layer 24 formed on the sidewall portions of the FG1 and the FG2 has, for example, an L-shape or an L-shaped symmetrical structure. In addition, the device surface portion is covered with an interlayer insulating film such as polyimide PI.

In the non-volatile semiconductor memory device according to the present embodiment, voids exist in portions of a specific dimension, specifically, portions of a minimum dimension between relatively wide FGs.

Existence of electric charges in SiN (nitride film) and $SiO_2$ (oxide film) near the FGs greatly influences data retention. Although a degree of influence of the SiN is large, an electrical influence from the $SiO_2$ (oxide film) can be suppressed if absolute amount near the FGs can be reduced even in the $SiO_2$ (oxide film).

In the non-volatile semiconductor memory device according to the present embodiment, by forming a void (air gap) under the SiN between the FGs, the FGs can be separated in distance from the SiN in the lateral direction. Further, since voids are provided between the FGs of adjacent memory cells, it is possible to reduce an absolute amount of the oxide film existing near the FGs, to reduce the electrical influence on the FGs, and to improve data retention characteristics.

For example, by intentionally forming void on SiN between FGs, it is possible to reduce the absolute amount of the oxide film near the FGs, to reduce the electrical influence on the FGs, and to improve data retention characteristics. Since the void (air gap) portion is vacuum, a relative permittivity becomes a minimum of 1. On the other hand, since the relative permittivity of $SiO_2$ is 3.9 and the relative permittivity of SiN is 7.5, the influence of parasitic capacitance can be suppressed by providing a void (air gap) structure.

Further, a combination of the dummy gate structure and the void structure described above may also improve the data retention characteristics more effectively.

(Memory Cell Array)

Figure 16:
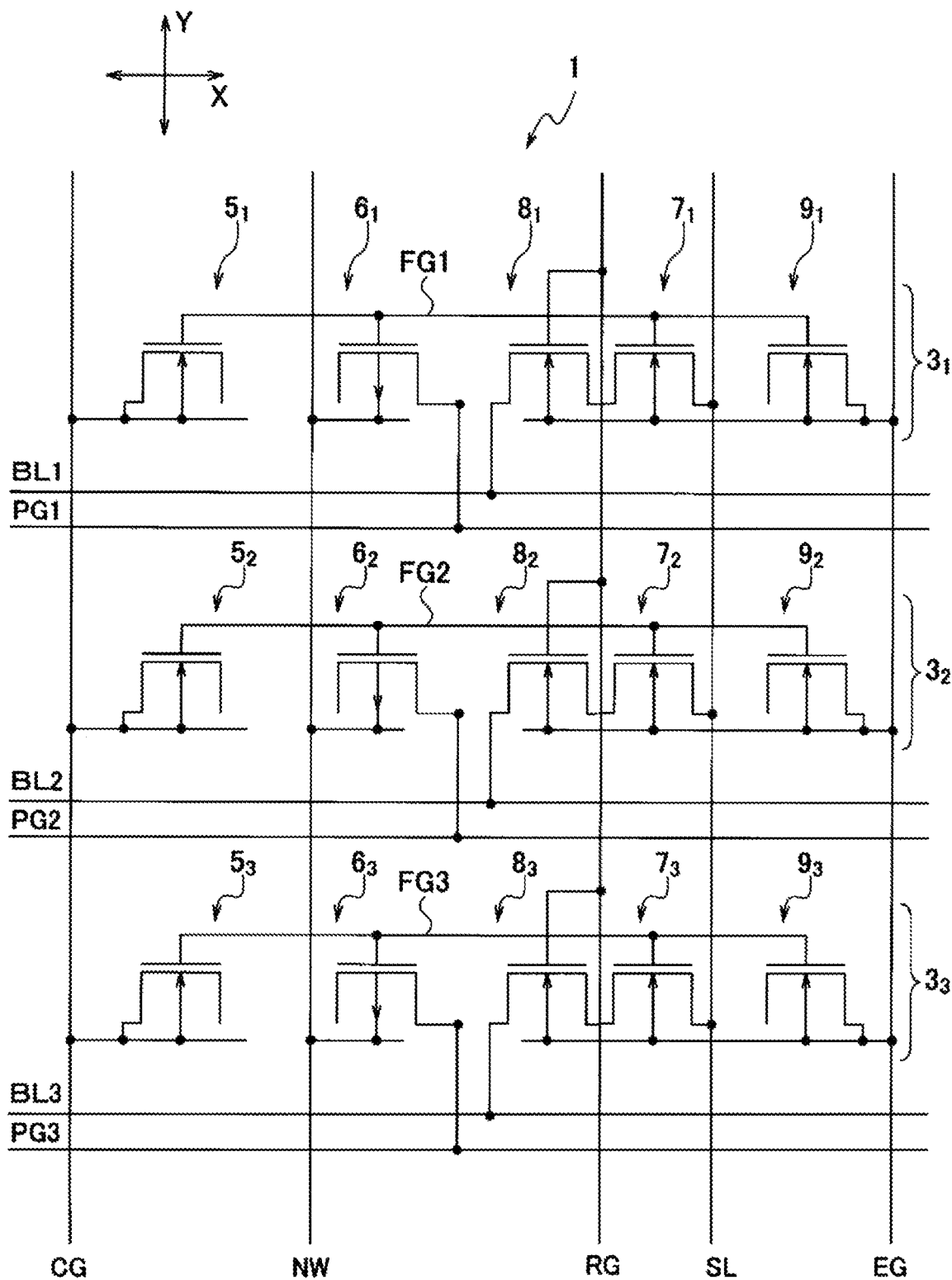
FIG. 16 is a circuit configuration diagram corresponding to FIG. 15 in the non-volatile semiconductor memory device according to the present embodiment.

A schematic plan pattern configuration example of FG1, FG2, and FG3, a plurality of dummy gates DG, and active regions of three adjacent memory cells $3_1$, $3_2$, and $3_3$ in the non-volatile semiconductor memory device according to the present embodiment is illustrated in FIG. 15. Further, a circuit configuration corresponding to FIG. 15 is illustrated in FIG. 16. As illustrated in FIG. 15, a coupling capacitor $5_1$, a program transistor $6_1$, a read transistor $7_1$, a switch transistor $8_1$, and an erase capacitor $9_1$ are arranged in an active region of the memory cell $3_1$. Although detailed illustration is omitted, similar arrangement applies to active regions of the memory cells $3_2$ and $3_3$.

As illustrated in FIG. 16, the three memory cells $3_1$, $3_2$, and $3_3$ are arranged adjacent to each other in a Y direction. Write bit lines PG1, PG2, and PG3 are connected to sources and drains of program transistors $6_1$, $6_2$, and $6_3$, and read bit lines BL1, BL2, BL3 are connected to the other one of sources and drains of the switch transistors $8_1$, $8_2$, and $8_3$. A coupling gate line CG is connected to sources and drains of coupling capacitors $5_1$, $5_2$, and $5_3$. A substrate voltage line NW is connected to an N well NW2 of the program transistor. A source line SL is connected to sources and drains of read transistors $7_1$, $7_2$, and $7_3$. A switch gate line (word line) RG (WL) is connected to a gate of the switch transistor. An erase gate line EG is connected to sources and drains of erase capacitors $9_1$, $9_2$, and $9_3$.

The write bit lines PG1, PG2, and PG3 and the read bit lines BL1, BL2, and BL3 extend in the X direction (column direction). The coupling gate line CG, the substrate voltage line NW, the source line SL, the switch gate line RG, and the erase gate line EG extend in the Y direction.

Figure 17:
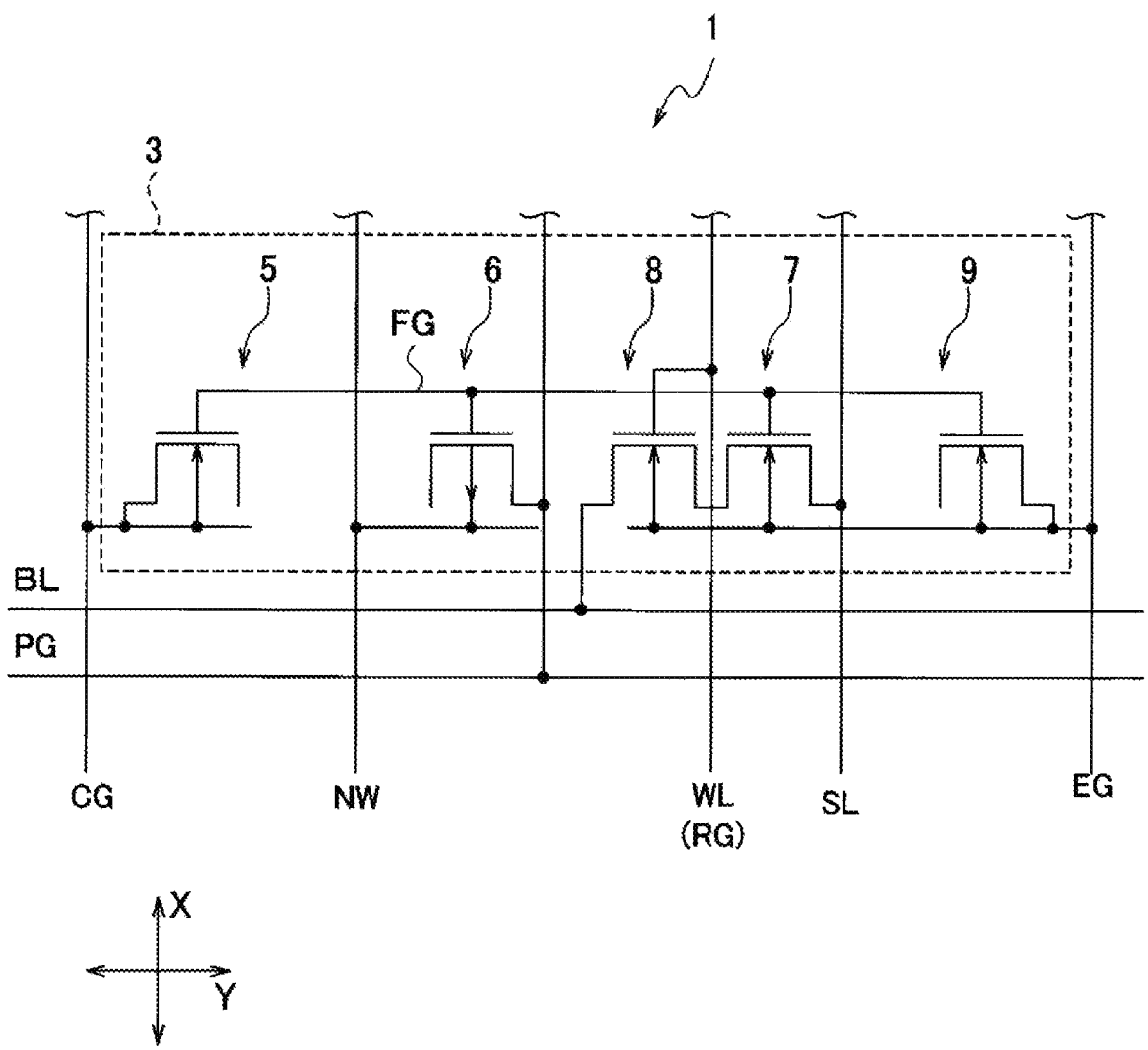
FIG. 17 is a wiring configuration example for one memory cell in the non-volatile semiconductor memory device according to the present embodiment.
Figure 18:
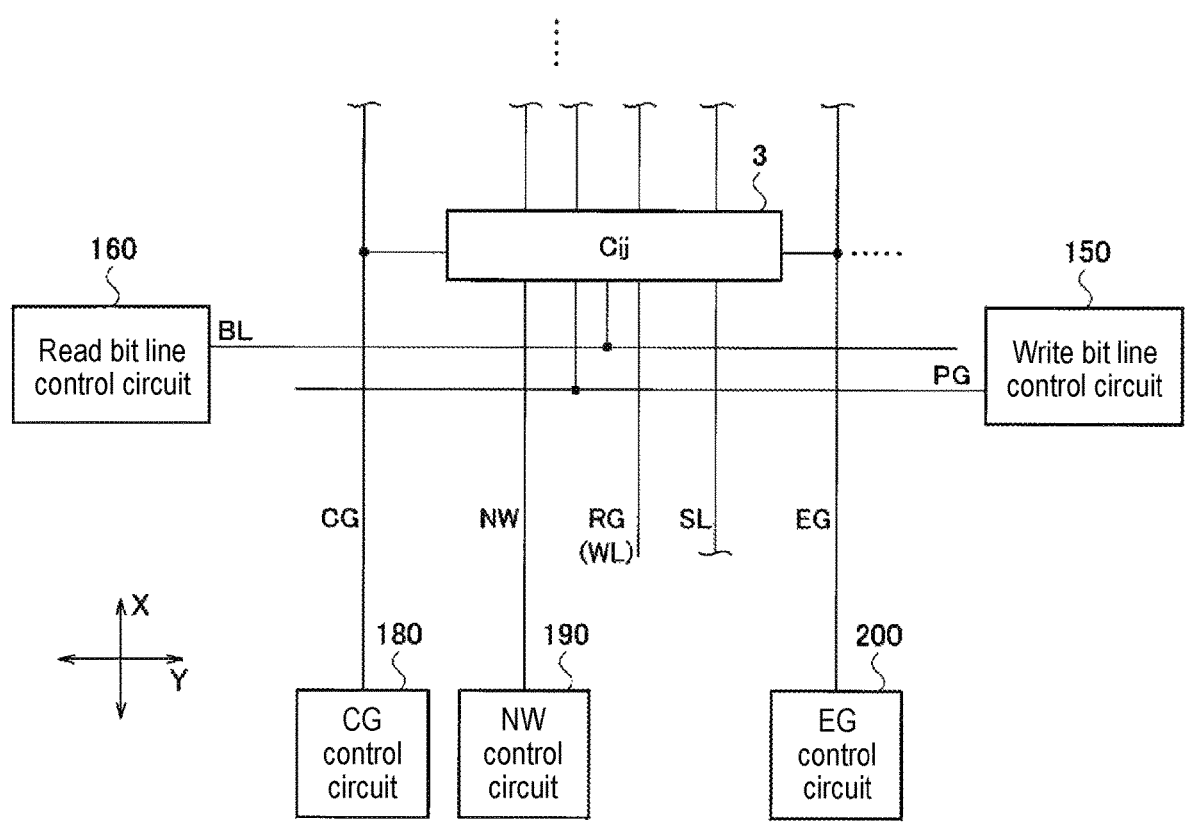
FIG. 18 is a diagram illustrating a peripheral circuit configuration in the non-volatile semiconductor memory device according to the present embodiment.

A wiring configuration example for the memory cell 3 in the non-volatile semiconductor memory device 1 according to the present embodiment is illustrated in FIG. 17. Further, a peripheral circuit configuration example for the memory cell 3 is illustrated in FIG. 18. Although only one cell $C_{ij}$ is arranged in the memory cell 3 in FIGS. 17 and 18, a plurality of memory cells 3 may be arranged in a matrix form in the X direction (column direction) and the Y direction (row direction).

As illustrated in FIG. 17, the non-volatile semiconductor memory device 1 according to the present embodiment has a write bit line PG extending in the X direction, a read bit line BL extending in the X direction, a coupling gate line CG extending in the Y direction, a substrate voltage line NW extending in the Y direction, a switch gate line RG extending in the Y direction, a source line SL extending in the Y direction, and an erase gate line EG extending in the Y direction. A plurality of write bit lines PG and read bit lines BL are arranged according to the number of memory cells 3 arranged in the X direction. Similarly, a plurality of coupling gate lines CG, substrate voltage lines NW, switch gate lines RG, source lines SL, and erase gate lines EG are arranged according to the number of memory cells 3 arranged in the Y direction.

As illustrated in FIG. 18, a read bit line control circuit 160 is connected to the read bit line BL, and a write bit line control circuit 150 is connected to the write bit line PG. In addition, a coupling gate line control circuit 180 is connected to the coupling gate line CG, a substrate voltage line control circuit 190 is connected to the substrate voltage line NW, and an erase gate line control circuit 200 is connected to the erase gate line EG.

Other Embodiments

Although some embodiments have been described as discussed above, the description and drawings constituting a part of the present disclosure are illustrative and should not be construed as being limited. From this disclosure, various alternative embodiments, examples, and operation techniques will be apparent to those skilled in the art.

As described above, the present embodiment includes various embodiments not described herein.

The non-volatile semiconductor memory device of the present embodiment is applied to an LSI equipped with an MTP, and is applicable to a wide range of application fields, such as solid information retention of a chip, initial setting, fine adjustment of characteristics, or the like.

According to the present disclosure in some embodiments, it is possible to provide a non-volatile semiconductor memory device having excellent data retention characteristics.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A non-volatile semiconductor memory device, comprising:
   a semiconductor substrate;
   a first insulating layer disposed on the semiconductor substrate;
   a first conductive layer disposed on the first insulating layer and constituting a first floating gate of one of memory cells adjacent to each other;
   a second conductive layer disposed on the first insulating layer and constituting a second floating gate of another one of the memory cells adjacent to each other;
   a third insulating layer covering the first conductive layer and the second conductive layer in a vertical direction in a cross-sectional view;
   a fourth insulating layer disposed on the third insulating layer; and
   an air gap region arranged between the third insulating layer and the fourth insulating layer, and disposed between the first conductive layer and the second conductive layer,
   wherein the fourth insulating layer is disposed not to be in direct contact with the first conductive layer and the second conductive layer, and
   wherein the third insulating layer is in direct contact with the semiconductor substrate.

2. The device of claim 1, further comprising a second insulating layer disposed on sidewalls of the first conductive layer and the second conductive layer.

3. The device of claim 2, wherein each of the memory cells includes a program transistor, a coupling capacitor, a read transistor, an erase capacitor, and a switch transistor in which one of a source and a drain of the switch transistor is connected to one of a source and a drain of the read transistor and connected in series to the read transistor, and
   wherein the program transistor, the coupling capacitor, the read transistor, and the erase capacitor share a floating gate.

4. The device of claim 3, wherein the first conductive layer includes a first polysilicon layer, the second conductive layer includes a second polysilicon layer, the first insulating layer includes a gate oxide film, the second insulating layer includes a silicon nitride film, the fourth insulating layer includes a contact etch stop nitride film, and the third insulating layer includes a salicide block oxide film.

5. The device of claim 4, further comprising a third polysilicon layer disposed adjacent to the first polysilicon layer in a direction orthogonal to a longitudinal direction of the first polysilicon layer in a plan view,
   wherein the third polysilicon layer is disposed on the first insulating layer and is covered with the third insulating layer and the fourth insulating layer disposed on the third insulating layer.

6. The device of claim 5, further comprising a fourth polysilicon layer disposed adjacent to the first polysilicon layer in the direction orthogonal to the longitudinal direction of the first polysilicon layer and disposed so as to face the third polysilicon layer with the first polysilicon layer interposed therebetween in the plan view,
   wherein the fourth polysilicon layer is disposed on the first insulating layer and is covered with the third insulating layer and the fourth insulating layer disposed on the third insulating layer.

7. The device of claim 3, further comprising:
   a coupling gate line connected to the coupling capacitor;
   a substrate voltage line connected to a substrate of the program transistor;
   a bit line connected to the source and the drain of the switch transistor;
   a switch gate line connected to a gate of the switch transistor;
   a source line connected to the source and the drain of the read transistor; and
   an erase gate line connected to a source and a drain of the erase capacitor.

8. The device of claim 7, further comprising a plurality of write bit lines extending in a column direction, a plurality of read bit lines extending in the column direction, and a plurality of switch gate lines extending in a row direction,
   wherein each of the memory cells is disposed between each of the write bit lines and each of the read bit lines, each of the write bit lines is connected to a source and a drain of the program transistor, and each of the read bit lines is connected to the other one of the source and the drain of the switch transistor.

9. The device of claim 8, further comprising:
   a read bit line control circuit connected to the read bit lines;
   a write bit line control circuit connected to the write bit lines;
   a substrate voltage line control circuit connected to the substrate voltage line;
   a coupling gate line control circuit connected to the coupling gate line; and
   an erase gate line control circuit connected to the erase gate line.

* * * * *

UNITED STATES PATENT AND TRADEMARK OFFICE
CERTIFICATE OF CORRECTION

| | | |
|---|---|---|
| PATENT NO. | : 12,075,617 B2 | Page 1 of 1 |
| APPLICATION NO. | : 16/931164 | |
| DATED | : August 27, 2024 | |
| INVENTOR(S) | : Toshiyuki Kanaya | |

It is certified that error appears in the above-identified patent and that said Letters Patent is hereby corrected as shown below:

On the Title Page

Please add Item (30) Foreign Application Data
Jul. 18, 2019 (JP) ..................... 2019132451

Signed and Sealed this
Fifteenth Day of October, 2024

Katherine Kelly Vidal
*Director of the United States Patent and Trademark Office*